United States Patent
Bae

(10) Patent No.: US 8,169,823 B2
(45) Date of Patent: May 1, 2012

(54) MEMORY DEVICES HAVING VOLATILE AND NON-VOLATILE MEMORY CHARACTERISTICS AND METHODS OF OPERATING THE SAME

(75) Inventor: Dong-II Bae, Daejeon (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 393 days.

(21) Appl. No.: 12/458,299

(22) Filed: Jul. 8, 2009

(65) Prior Publication Data

US 2010/0008139 A1   Jan. 14, 2010

(30) Foreign Application Priority Data

Jul. 8, 2008   (KR) .................. 10-2008-0066261

(51) Int. Cl.
    *G11C 11/34*   (2006.01)
(52) U.S. Cl. ............. 365/185.05; 365/185.18; 365/185.2
(58) Field of Classification Search ............. 365/185.05, 365/185.18, 185.2
    See application file for complete search history.

(56) References Cited

U.S. PATENT DOCUMENTS

| | | | | |
|---|---|---|---|---|
| 6,282,120 | B1 * | 8/2001 | Cernea et al. | 365/185.21 |
| 7,082,056 | B2 * | 7/2006 | Chen et al. | 365/185.2 |
| 7,116,577 | B2 * | 10/2006 | Eitan | 365/185.03 |

FOREIGN PATENT DOCUMENTS

| | | |
|---|---|---|
| KR | 10-0560301 | 3/2006 |
| KR | 10-0719178 | 5/2007 |
| KR | 10-0810614 | 2/2008 |

OTHER PUBLICATIONS

An English language abstract of Korean Publication No. KR 10-2008-0018040, published Feb. 27, 2008.
An English language abstract of Korean Publication No. KR 10-2005-0021862, published Mar. 7, 2005.
An English language abstract of Korean Publication No. KR 10-2005-0071307, published Jul. 7, 2005.

* cited by examiner

*Primary Examiner* — Son Dinh
(74) *Attorney, Agent, or Firm* — Harness, Dickey & Pierce, PLC

(57) ABSTRACT

Multi-bit semiconductor memory devices having both volatile and nonvolatile memory characteristics and methods of operating the same are disclosed, the semiconductor memory device including a floating body on an upper region of a substrate, a gate electrode on the floating body and electrically insulated from the floating body, source and drain regions on the substrate adjacent to the gate electrode and a charge trap layer between the floating body and the gate electrode, where first bit data is written in one of the charge trap layer and the floating body, and second bit data is written in one of the charge trap layer and the floating body in which first bit data is not written.

19 Claims, 7 Drawing Sheets

MEMORY DEVICES HAVING VOLATILE AND NON-VOLATILE MEMORY CHARACTERISTICS AND METHODS OF OPERATING THE SAME

PRIORITY STATEMENT

This application claims priority under 35 U.S.C. §119 to Korean Patent Application No. 2008-66261, filed on Jul. 8, 2008, in the Korean Intellectual Property Office (KIPO), the entire contents of which is incorporated herein by reference.

BACKGROUND

1. Field

Example embodiments relate to memory devices having characteristics of volatile memory (e.g., dynamic random access memory (DRAM)) and non-volatile memory (e.g., flash memory) and methods of operating the same. More particularly, example embodiments relate to memory cells having volatile and nonvolatile characteristics and multi-bit methods of operating the same.

2. Description of the Related Art

Semiconductor devices include non-volatile memory devices, such as flash memory, and volatile memory devices, such as dynamic random access memory (DRAM). A flash memory may maintain data stored in a memory cell when power is turned off. However, because of the time required to repeatedly write and/or erase data in a memory cell of a flash, a flash memory may not be suitable for frequently rewriting data. The number of times writing and/or erasing data may be repeated may be limited when using a flash memory.

A DRAM may not maintain data stored in a memory cell when power is turned off. Data stored in each memory cell of a DRAM may require steps to periodically refresh the DRAM in order to maintain a data state. However, because repeatedly writing or erasing data in the memory cell of the DRAM takes little and/or decreased time, there may be no limit to the number of times the operation of writing or erasing data can be repeated in the DRAM.

DRAM memory cells are becoming gradually smaller as memory devices are produced with increased storage capacity within a limited area (e.g., increased integration density). A one-transistor (1T) DRAM including a single transistor without a capacitor in a memory cell thereof improves integration density over memory cells requiring a transistor and a capacitor. The 1T DRAM may write data by trapping charges in a floating body or removing charges from a floating body, and may sense data by detecting a difference between threshold voltages of the transistor caused by the trapped charges.

Although integration density is improved by using 1T DRAM technology, limitations in reducing the size of a 1T DRAM cell exist. Further, the number of cells included in a DRAM increases as DRAM capacity is increased, resulting in large sized DRAMs. A memory device having a multi-bit cell capable of storing two or more data states using one cell and a method of operating the memory device may improve integration density.

SUMMARY

Example embodiments provide semiconductor memory devices having volatile and non-volatile memory characteristics and methods of reading and writing two or more bits of data in one memory cell of the same. Example embodiments provide a method of reading two or more bits of data written to one cell in a memory device having characteristics of DRAM and non-volatile memory.

According example embodiments, there are provided methods of writing data in a semiconductor memory device. The memory device includes a floating body on a substrate, a gate electrode on the floating body and electrically insulated from the floating body, source and drain regions on the substrate adjacent to the gate electrode and a charge trap layer between the floating body and the gate electrode. First bit data is written to the charge trap layer and second bit data is written to the floating body.

In an example embodiment, writing first bit data may include trapping a charge in the charge trap layer or erasing a charge from the charge trap layer. Trapping the charge in the charge trap layer may include using hot carrier injection (HCI) or Fowler-Nordheim (FN) tunneling. In an example embodiment, a gate programming voltage may be applied to the gate electrode, a drain programming voltage may be applied to the drain region and a voltage lower than the first drain programming voltage may be applied to the source region, so that the charge may be trapped in the charge trap layer.

In an example embodiment, a gate programming voltage may be applied to the gate electrode and the drain and source regions may be grounded, so that the charge may be trapped in the charge trap layer. In an example embodiment, a negative gate erasing voltage may be applied to the gate electrode and the drain and source regions may be grounded, so that the charge in the charge trap layer may be erased.

In an example embodiment, the second bit data may be written by storing holes in the floating body or erasing holes from the floating body. An impact ionization method, a gate-induced drain leakage (GIDL) method and/or a bipolar junction transistor (BJT) method may be used for storing holes in the floating body. In an example embodiment, a gate programming voltage may be applied to the gate electrode, a drain programming voltage may be applied to the drain region and a voltage lower than the drain programming voltage may be applied to the source region, so that the holes may be stored in the floating body.

In an example embodiment, a negative gate programming voltage may be applied to the gate electrode and a positive voltage may be applied to the source and drain regions, so that the holes may be stored in the floating body. In an example embodiment, a positive gate voltage may be applied to the gate electrode, a negative erasing voltage may be applied to the drain region and the source region may be grounded, so that the holes may be erased from the floating body.

In an example embodiment, the first bit data may be a least significant bit (LSB) of multi-bit data and the second bit data may be a most significant bit (MSB) of the multi-bit data. In an example embodiment, the first bit data may be a MSB of multi-bit data and the second bit data may be a LSB of the multi-data. In an example embodiment, the method may further comprise refreshing data of the second bit data written to the floating body.

According example embodiments, there is provided a method of reading data in a semiconductor memory device. The semiconductor memory device includes a floating body on a substrate, a gate electrode on the floating body and electrically insulated from the floating body, source and drain regions on the substrate adjacent to the gate electrode, and a charge trap layer between the floating body and the gate electrode. A reading voltage is applied to the gate electrode, a drain voltage for reading is applied to the drain region, and a voltage lower than the drain voltage for reading is applied to the source region. Multi-level data of the memory is output by comparing a drain current from the memory with reference currents.

In an example embodiment, the reference currents may include a first reference current for classifying LSB data, and second and third reference currents for classifying MSB data. In an example embodiment, the first reference current may be determined to have a value between a first drain current when the LSB data is "0" and a second drain current when the LSB data is "1" under conditions in which a reading voltage is applied to the gate electrode. The second reference current may be determined to have a value between the second drain current and a third drain current when the MSB data is "1" under conditions in which the least significant data is determined as "1" and the reading voltage is applied to the gate electrode. The third reference current may be determined to have a value between the first drain current and a fourth drain current when the MSB data is "0" under conditions in which the most least significant data is determined as "0" and the reading voltage is applied to the gate electrode.

In an example embodiment, the LSB data may be classified by comparing the drain current with the first reference current. The MSB data may be classified by comparing the drain current with the second reference current when the LSB data is "1". The MSB data may be classified by comparing the drain current with the third reference current when the LSB data is "0".

According to example embodiments, there is provided a method of reading data in a semiconductor memory device. The semiconductor memory device includes a floating body on a substrate, a gate electrode on the floating body and electrically insulated from the floating body, source and drain regions on the substrate adjacent to the gate electrode, and a charge trap layer between the floating body and the gate electrode. A drain voltage for reading is applied to the drain region of the memory, and a voltage lower than the drain voltage for reading is applied to the source region of the memory cell. Reference voltages for reading sequentially are applied to the gate electrode. Multi-bit data of the memory is output by determining whether or not a drain current flows under conditions in which one or more of the reference voltages is applied to the gate electrode.

In an example embodiment, the reference voltages may include a first reference voltage for classifying LSB data, and a second reference voltage and a third reference voltage for classifying MSB data. In an example embodiment, the first reference voltage may be determined to have a value between a first threshold voltage and a second threshold voltage. The first threshold voltage is a voltage when the LSB data is "0" and the MSB data is "1", the second threshold voltage is a voltage when the LSB data is "1" and the MSB data is "0". The second reference voltage may be determined to have a value between the second threshold voltage and a third threshold voltage. The third threshold voltage may be a voltage when the MSB data is "1", under conditions in which the LSB data is determined as "1". The third reference voltage may be determined to have a value between the first threshold voltage and a fourth threshold voltage. The fourth threshold voltage may be a voltage when the MSB is "0" and the LSB is "0".

In an example embodiment, in order to output the multi-level data of the memory cell, the LSB data may be classified according to whether or not a drain current flows when the reference voltage is applied to the gate electrode. The second reference voltage may be applied to the gate electrode and the MSB data may be classified according to whether or not a drain current flows when the LSB data is "1". The third reference voltage may be applied to the gate electrode and the MSB data may be classified according to whether or not a drain current flows when the LSB data is "0".

According to example embodiments, there is provided a method of reading data in a semiconductor memory device. The semiconductor memory device includes a floating body on a substrate, a gate electrode on the floating body and electrically insulated from the floating body, source and drain regions on the substrate adjacent to the gate electrode and a charge trap layer between the floating body and the gate electrode. A drain voltage for reading is applied to the drain region, and a voltage substantially lower than the drain voltage for reading is applied to the source region. A drain voltage for reading is applied to the drain region, and a voltage lower than the drain voltage for reading is applied to the source region. A reference voltage for reading is applied to the gate electrode. LSB data is classified by determining whether a drain current flows or not under conditions in which the reference voltage for reading is applied to the gate electrode. A first reading voltage is applied to the gate electrode when the LSB data is "1", and a drain current output by applying the first reading voltage is compared with a first reference current to output multi-bit data. A second reading voltage is applied to the gate electrode when the LSB data is "0", and a drain current output is compared with a second reference current to output multi-level data.

In an example embodiment, the reference voltage for reading may be determined to have a value between a threshold voltage when the LSB data is "0" and a threshold voltage when the LSB data is "1". In an example embodiment, the first reading voltage may have a voltage lower than the second reading voltage. In an example embodiment, the first reference current may be determined to have a value between a drain current when the MSB data is "0" and a drain current when the MSB data is "1" under conditions in which the first reading voltage is applied to the gate electrode and the LSB data is determined as "1". In an example embodiment, the second reference current may be determined to have a value between a drain current when the MSB data is "0" and a drain current when the MSB data is "1" under conditions in which the second reading voltage is applied to the gate electrode and the LSB data is determined as "0".

According to the example embodiments, two or more bit data may be stored in one cell. Accordingly, a memory device having a high and/or improved capacity may be obtained.

BRIEF DESCRIPTION OF THE DRAWINGS

Example embodiments will be more clearly understood from the following brief description taken in conjunction with the accompanying drawings. FIGS. 1-10 represent non-limiting, example embodiments as described herein.

FIG. 1 is a cross-sectional diagram illustrating a unit cell of a memory device according to example embodiments;

FIG. 2 is a conceptual equivalent circuit diagram according to example embodiments;

FIG. 3 is a cross-sectional diagram illustrating a unit cell of a memory device according to example embodiments;

FIG. 4 is a flowchart illustrating a method of writing data in a cell of a memory device according to example embodiments;

FIG. 6 is a graph illustrating a distribution of threshold voltages, the threshold voltages corresponding to different multi-bit data states of a memory cell;

FIG. 7 is a graph of drain current as a function of gate voltage illustrating memory cell read currents corresponding to different multi-bit data states of a memory cell;

FIG. 8 is a graph of drain current as a function of gate voltage illustrating a method of reading multi-bit data using reference drain currents;

FIG. 9 is a graph of drain current as a function of gate voltage illustrating a method of reading multi-bit data using reference gate voltages; and FIG. 10 is a graph of drain current as a function of gate voltage illustrating a method of reading multi-bit data using a reference gate voltage and reference drain currents.

Figure 1:
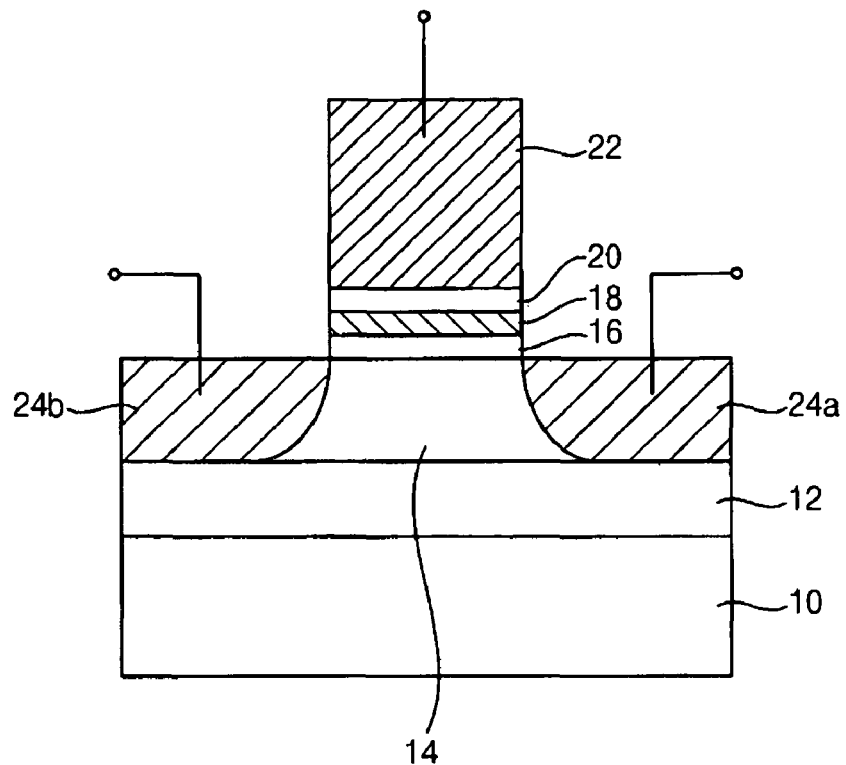

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
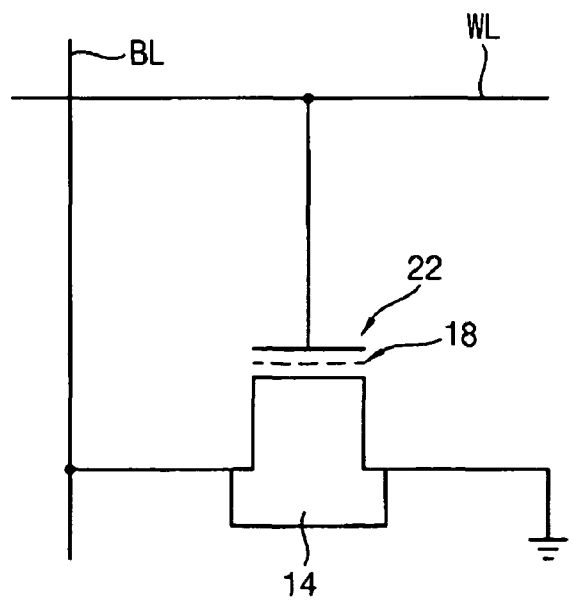

FIG. 1 is a cross-sectional diagram illustrating a unit cell of a memory device according to example embodiments. FIG. 2 is a conceptual equivalent circuit diagram according to example embodiments. Referring to FIGS. 1 and 2, a buried insulating layer 12 may be formed on a substrate 10. The substrate 10 may be, for example, a silicon-on-insulator (SOI) substrate. A floating body 14 may be formed on the buried insulating layer 12. The floating body may be implanted with impurities that are substantially different from impurities used to form source and drain regions (described below).

Charge carriers, for example holes, may be stored in the floating body 14. The floating body 14 may serve as a capacitor. To increase the capacitance of the floating body, the thickness of the floating body 14 may be reduced. The floating body 14 may be partially depleted to obtain a region for storing one or more charge carriers, for example holes, when the cell of the memory device is operated. The floating body 14 may have a high doping concentration in order to partially deplete the floating body 14. When the floating body 14 has a high doping concentration, stored holes may migrate out of the floating body 14. Thus, when the cell is operated, if the floating body 14 is doped with a low doping concentration a back gate voltage, which is a negative voltage, may be applied to a bottom surface of the substrate 10.

A gate insulation layer 16, a charge trap layer 18 and a blocking dielectric layer 20 may be formed on the floating body 14. The gate insulation layer 16 may include a dielectric (e.g., silicon oxide formed by thermal oxidation). The charge trap layer 18 may include an insulation material having trap sites. For example, the charge trap layer 18 may include silicon nitride, polysilicon and/or metal oxide having a high dielectric constant, and/or nanodots. The blocking dielectric layer 20 may include silicon oxide. A gate electrode 22 may be formed on the blocking dielectric layer 20. The gate electrode 22 may include a conductor, for example, the gate electrode 22 may be a polysilicon and/or metal. The gate electrode 22 may have a structure in which, for example, polysilicon and metal are stacked.

An external electric signal may be applied to the gate electrode 22. A signal line for applying the external electric signal to the gate electrode 22 may be electrically connected to the gate electrode 22. Source and drain regions 24a and 24b may be formed in an upper region of the substrate 10 and may be adjacent to the gate insulation layer 16. The source and drain regions 24a and 24b may be implanted with n-type impurities or p-type impurities. Hereinafter, example embodiments will be described with the understanding that source and drain regions 24a and 24b are doped with n-type impurities for ease of explanation.

Bottom surfaces of the source and drain regions 24a and 24b may be in contact with a surface of the buried insulating layer 12. The floating body 14 may be surrounded by the gate insulation layer 16, the source and drain regions 24a and 24b, and the buried insulating layer 12. The floating body 14 may be isolated by the gate insulation layer 16, the source and drain regions 24a and 24b, and the buried insulating layer 12 and holes may be trapped in the isolated floating body 14 or removed from the isolated floating body 14.

External electric signals may be applied to the source and drain regions 24a and 24b. Signal lines for applying the external electric signal to the source and drain regions 24a and 24b may be electrically connected to the source and drain regions 24a and 24b. Cells included in the memory device may be included in an array structure. A bit line may be electrically connected to a drain region of each cell and a word line may be electrically connected to gate electrode of each cell.

Figure 3:
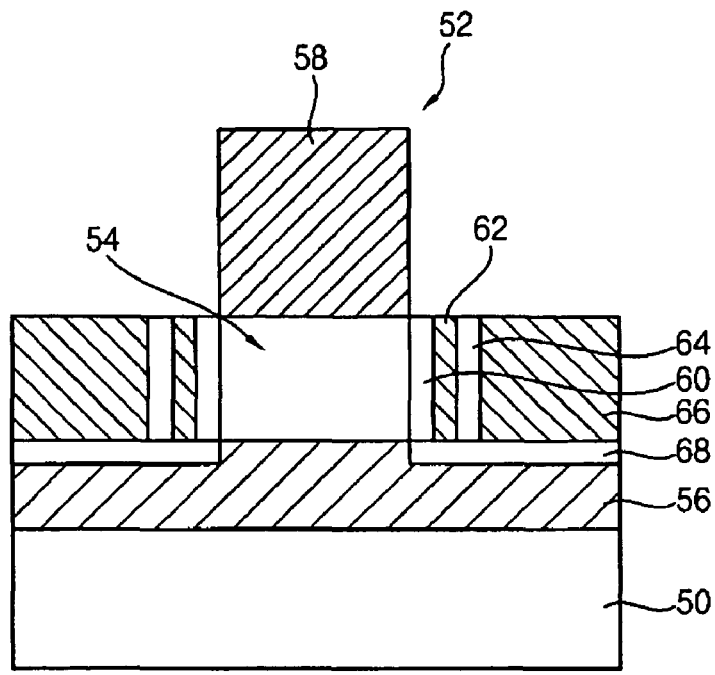

FIG. 3 is a cross-sectional diagram illustrating a unit cell of a memory device according to example embodiments. Referring to FIG. 3, a semiconductor pillar 52 may be on a substrate 50. For example, the semiconductor pillar may be formed from the material of the substrate. A floating body 54 may be on the substrate 50 and may be part of the semiconductor pillar 52. A portion of the substrate 50 composing the semiconductor pillar 52 may be provided as the floating body 54. A source 56 may be doped with impurities, on an upper region of the substrate 50, and may be the base of the semiconductor pillar 52. The source 56 may be connected to the floating body 54 (e.g., directly connected). A drain 58 may be doped with impurities and may be an upper region of the semiconductor pillar 52.

A gate insulation layer 60 may be on a sidewall of the semiconductor pillar 52. The gate insulation layer 60 may, for example, enclose the sidewalls of the semiconductor pillar 52. A charge trap layer 62 may be on the gate insulation layer 60 and a blocking dielectric layer 64 may be on the charge trap layer 62. The gate insulation layer 60 may include, for example, silicon oxide. The charge trap layer 62 may include insulation material having trap sites. For example, the charge trap layer may include silicon nitride, polysilicon, nanodots and/or metal oxide having a high dielectric constant. The blocking dielectric layer 64 may include, for example, silicon oxide.

A gate electrode 66 may be on the blocking dielectric layer 64. The gate electrode may cover and/or surround the floating body 54. The gate electrode 66 may include polysilicon and/or metal. For example, the gate electrode 66 may have a structure in which polysilicon and metal are stacked. The gate electrode 66 and a surface of the substrate 50 may be electrically insulated from each other. An source insulation layer 68 may be formed between a bottom region of the gate electrode 66 and an upper surface of the substrate 50. The floating body 54 may be isolated by the gate insulation layer 60 and the source and drain regions 56 and 58. Holes may be trapped in the floating body 54 or removed from the floating body 54.

Although not illustrated, a semiconductor memory device having a cell in which a flash memory structure is formed on an active region including a floating body may be operated using an operation method in accordance with example embodiments.

Hereinafter, methods of operating semiconductor memory devices in accordance with example embodiments will be described with reference to 2-bit memory cells, although methods according to example embodiments may apply to data cells storing more than 2 bits of data. Methods of operating semiconductor memory devices may include a data writing operation and a data reading operation. The data writing operation may change a threshold voltage of a selected memory cell to correspond to a data state (e.g., one of four states in a 2-bit memory cell). The data reading operation may identify the state of the memory cell.

Operation of Writing Data

Figure 4:
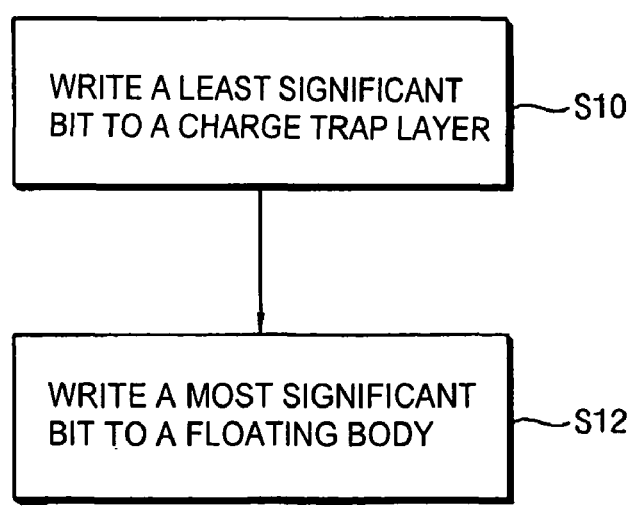

FIG. 4 is a flowchart illustrating a method of writing data in a cell of a memory device according to example embodiments. Referring to FIG. 4, a least significant bit (LSB) of 2-bit data may be written to a charge trap layer of a selected cell in step S10. According to the LSB, a charge carrier may be trapped in or erased from the charge trap layer. A most significant bit (MSB) of the 2-bit data may be written to a floating body of the selected cell in step S12. According to the MSB, one or more charge carriers (e.g., holes) may be trapped in or erased from the floating body. According to states of the charge carriers trapped in the charge trap layer and in the floating body, the selected cell may have one of at least four states. For example, the selected cell may have a state corresponding to one of four states (0,0), (0,1), (1,0) and (1,1). Hereinafter, a method of writing data will be described with reference to FIG. 2.

Step 1: Selecting a Cell

At least one cell among memory cells included in a semiconductor device may be selected.

Step 2: Writing LSB Data (Programming or Erasing)

A first bit may be written to a charge trap layer 18 included in the selected cell. According to example embodiments, the first bit may correspond to a LSB of multi-bit data. The selected cell may have one state that may be either a state in which a charge is trapped in a charge trap layer 18 or a state in which a charge is erased from the charge trap layer 18. According to example embodiments, the state in which the charge is trapped in a charge trap layer 18 may be referred to as a programming state or a data "0" state and the state in which a charge is erased from the charge trap layer 18 may be referred to as an erasing state or a data "1" state. When a threshold voltage becomes low, the data state may be "1" and when the threshold voltage becomes high, the data state may be "0".

A data state may be represented in the form (MSB,LSB). Because the first bit may correspond to the LSB of multi-bit data, when charges are trapped in the charge trap layer 18 and the LSB is "0", the data state of the memory cell in which the charge is trapped in a charge trap layer 18 may be determined as one among (1,0) and (0,0). When electrons are erased from the charge trap layer 18 and the LSB is "1", the data state of the memory cell in which the charge is erased from a charge trap layer 18 may be determined as one among (1,1) and (0,1).

Principles of trapping charges in the charge trap layer 18 may include, for example, hot carrier injection (HCI) and/or Fowler-Nordheim (FN) tunneling. For example, charges may be stored by one of HCI and FN tunneling. When charges are stored in the charge trap layer 18 using HCI, a first gate programming voltage may be applied to the gate electrode 22, a first drain programming voltage may be applied to the drain region 24b and the source region 24a may be grounded. For example, the first gate programming voltage may be in a range of about 6V to about 10V, and the first drain programming voltage may be in a range of about 2V to about 5V. A strong lateral electric field may be generated between the source region 24a and the drain region 24b. Hot electrons may be generated at a channel region adjacent to the drain region 24b. The hot electrons may overcome a potential barrier of the floating body 14 and the gate insulation layer 16, and migrate into an interface between the gate insulation layer 16 and the charge trap layer 18 and/or into the charge trap layer 18. A threshold voltage of the selected memory cell may be increased by the migrated hot electrons.

When charges are stored in the charge trap layer 18 using FN tunneling, a second gate programming voltage may be applied to the gate electrode 22 and the source and drain regions 24a and 24b may be grounded. The second gate programming voltage may be higher than the first gate programming voltage. For example, the second gate programming voltage may be in a range of about 8V to about 20V. Electrons may tunnel from the channel region to the charge trap layer 18 due to the second gate programming voltage and may migrate into an interface between the gate insulation layer 16 and the charge trap layer 18 and/or into the charge trap layer 18. A threshold voltage of the selected memory cell may be increased by the migrated electrons.

Hot hole injection (HHI) may be used in order to erase the charges from the charge trap layer 18. When the charges are erased from the charge trap layer 18 using HHI, the source and drain regions 24a and 24b may be grounded. A negative gate erasing voltage may be applied to the gate electrode 22. For example, the gate erasing voltage may be in a range of about −8V to about −15V. Accordingly, hot holes generated between the floating body 14 and the source region 24a or the drain region 24b may migrate into the interface between the gate insulation layer 16 and the charge trap layer 18 and/or into the charge trap layer 18. As a result, an erasing operation may be performed.

Step 3: Writing MSB Data (Programming or Erasing)

A second bit corresponding to a MSB among multi-bit data may be written to the floating body 14 included in the selected cell. The selected cell may have one state that may be either a state in which holes are trapped in the floating body 14 or holes are erased from the floating body 14 by the data writing operation. According to example embodiments, the state in which the holes are trapped in a floating body 14 is referred to as a programming state or a data "1" state and the state in which holes are erased from the floating body 14 is referred to as an erasing state or a data "0" state. Because the second bit corresponds to the MSB of multi-bit data, when holes are trapped in the floating body 14, the MSB is written as "1", so that the data state of the memory cell in which the holes are trapped in a floating body 14 is determined as one among (1,1) and (1,0). When holes are erased from the charge trap layer 18, the MSB is written as "0", so that the data state of the memory cell in which the charge is erased from floating body 14 is determined as one among (0,1) and (0,0).

Examples of methods of trapping holes in a floating body 14 may include, for example, impact ionization, gate-induced drain leakage (GIDL), and bipolar junction transistor (BJT) hole trapping. The holes may be trapped in the floating gate using any hole trapping method. Hereinafter, the impact ionization method, the GIDL method and the BJT method may be described.

Impact Ionization Method

A third gate voltage greater than a threshold voltage may be applied to the gate electrode 22 in order to trap holes in the floating body 14 using the impact ionization method. A second drain programming voltage may be applied to the drain region 24b and the source region 24a may be grounded. The third gate voltage may be in a range of about 1.5V to about 3V and the second drain programming voltage may be in a range of about 2V to about 4V.

Electron-hole pairs may be generated in a portion of the floating body 14 adjacent to the drain region 24b by applying the voltages to the gate electrode 22 and the drain region 24b. The electrons of the electron-hole pairs may be erased through the source and drain regions 24a and 24b. The holes of the electron-hole pairs may be accumulated in the floating body 14. The accumulated holes may increase the electric potential of the floating body 14. The threshold voltage may be reduced by the increase of the electric potential.

Programming Using GIDL

A fourth gate programming voltage may applied to the gate electrode 22 in order to trap holes in the floating body 14 using GIDL. The fourth gate programming voltage may be a negative voltage. Positive voltages may be applied to the source and drain regions 24a and 24b. Electron-hole pairs may be generated in a region of the floating body 14 adjacent to the drain region 24b by applying the voltages to the gate electrode 22 and the drain region 24b. The electrons of the electron-hole pairs may be erased through the source and drain regions 24a and 24b. The holes of the electron-hole pairs may be accumulated in the floating body 14. The accumulated holes may increase the electric potential of the floating body 14. The threshold voltage may be reduced by the increase of the electric potential.

Programming Using BJT

According to an example BJT method, holes may be trapped in the floating body 14 using a structure in which a source region, a floating body and a drain region form an NPN bipolar transistor or a PNP bipolar transistor. The source region/floating body may be forward biased and the floating body/drain region may be reverse biased to generate holes, and the holes may accumulate in a channel region. The holes may be generated on a surface of the substrate beneath the gate insulation layer. A negative voltage may be applied to the gate electrode and the drain and source regions may be grounded, which may maintain holes in the channel region. Applying a negative voltage and grounding the drain and source regions may be referred to as a "hold" state. After performing an operation, the "hold" state may be maintained.

Programming using a BJT may be different from a method of changing a threshold voltage using a field effect. When programming using BJT, the memory cell may be turned on or turned off according to whether or not the holes are accumulated in the channel region. When the holes are accumulated in the channel region of the memory cell, the memory cell may be turned on. When a negative voltage is applied to a gate and a reading voltage is applied to the drain region, current may flow. When the holes are not accumulated in the channel region of the memory cell, the memory cell may be turned off. Even if a negative voltage is applied to a gate and a reading voltage is applied to the drain region, current may not flow. Because a current level difference increases according to whether the memory cell is programmed or not, a sense margin may be increased. Data stored in the floating body may be easily read using the current.

Erasing

When a memory cell is programmed using the impact ionization or GIDL, data may be erased by at least the following methods.

According to example embodiments, holes trapped in the floating body 14 may be erased through the drain region 24b. The source region 24a may be grounded. A fifth gate voltage, which is positive, may be applied to the gate electrode 22. A third drain voltage, which is negative, may be applied to the drain region 24b. The fifth gate voltage may be in a range of about 1.5V to about 3V The third drain voltage may be in a range of about −2V to about −4V.

According to example embodiments, a negative voltage may be applied to the source and drain regions 24a and 24b, and the gate electrode 22 may float. The negative voltage applied to the source and drain regions 24a and 24b may be about −2V. Alternatively, when about 0 V is applied to the source region 24a, −2V may be applied to the drain region 24b.

When a memory cell is programmed or erased using impact ionization or GIDL, the floating body 14 may be totally depleted in a standby state if the floating body 14 does not have a sufficient doping concentration. In this case, a back gate voltage having a negative voltage may be applied to a bottom surface of the substrate 10 when the writing operation and the reading operation are performed. The floating body 14 may be partially depleted by applying a negative voltage to the substrate 10 under the buried insulation layer 12. Generally, the back gate voltage may be in a range of about −30V to about −50 V.

When a memory cell is programmed by the BJT method, data may be removed by the following methods. In the hold state in which a negative voltage is applied to a gate, a positive voltage may be applied to the gate electrode. The voltage barrier may become low so that accumulated holes are erased. After the accumulated holes are erased, the memory cell may resume the hold state.

2-bit data may be written to a selected cell by performing the above steps. Regarding the MSB, a refreshing step may be periodically performed to keep holes trapped in the floating body 14 after the writing operation. Tables 1-4 may show conditions for writing 2-bit data in a cell according to each method of programming. Values in Tables 1-4 are not fixed, may be one point of a possible range and are only examples which are applied to the cell.

TABLE 1

| Data | Writing LSB (Charge trap layer) | | Writing MSB (Floating body) | | |
|---|---|---|---|---|---|
| | Gate Voltage | Drain Voltage | Gate Voltage | Drain Voltage | Back Gate |
| (1, 0) | 8 V | GND | 1.5 V | 3.5 V | −40 V |
| (0, 0) | 8 V | GND | 1.5 V | −3.0 V | −40 V |
| (1, 1) | −8 V | GND | 1.5 V | 3.5 V | −40 V |
| (0, 1) | −8 V | GND | 1.5 V | −3.0 V | −40 V |
| Method of programming | FN tunneling | | Impact ionization | | |

TABLE 2

| Data | Writing LSB (Charge trap layer) | | Writing MSB (Floating body) | | |
|---|---|---|---|---|---|
| | Gate Voltage | Drain Voltage | Gate Voltage | Drain Voltage | Back Gate |
| (1, 0) | 6 V | 2 V | −4 V | 3.5 V | −40 V |
| (0, 0) | 6 V | 2 V | 1.5 V | −3.0 V | −40 V |
| (1, 1) | −8 V | GND | −4 V | 3.5 V | −40 V |
| (0, 1) | −8 V | GND | 1.5 V | −3.0 V | −40 V |
| Method of programming | Hot carrier injection | | GIDL | | |

TABLE 3

| Data | Writing LSB (Charge trap layer) | | Writing MSB (Floating body) | | |
|---|---|---|---|---|---|
| | Gate Voltage | Drain Voltage | Gate Voltage | Drain Voltage | Back Gate |
| (1, 0) | 8 V | GND | −4 V | 3.5 V | −40 V |
| (0, 0) | 8 V | GND | 1.5 V | −3.0 V | −40 V |
| (1, 1) | −8 V | GND | −4 V | 3.5 V | −40 V |
| (0, 1) | −8 V | GND | 1.5 V | −3.0 V | −40 V |
| Method of programming | FN tunneling | | GIDL | | |

TABLE 4

| Data | Writing LSB (Charge trap layer) | | Writing MSB (Floating body) | | |
|---|---|---|---|---|---|
| | Gate Voltage | Drain Voltage | Gate Voltage | Drain Voltage | Back Gate |
| (1, 0) | 6 V | 2 V | 1.5 V | 3.5 V | −40 V |
| (0, 0) | 6 V | 2 V | 1.5 V | −3.0 V | −40 V |
| (1, 1) | −8 V | GND | 1.5 V | 3.5 V | −40 V |
| (0, 1) | −8 V | GND | 1.5 V | −3.0 V | −40 V |
| Method of programming | Hot carrier injection | | Impact ionization | | |

As shown in Tables 1-4, 2-bit data may be written in a memory cell using various methods.

In the above description, data stored in the charge trap layer may be the LSB and data stored in the floating body may be the MSB. According to example embodiments, data stored in the charge trap layer may be the MSB and data stored in the floating body may be the LSB. In this case, after writing data in the floating body, data may be written in the charge trap layer. Methods of applying voltages for writing data in the floating body and the charge trap layer are substantially the same as those described above and detailed descriptions are omitted.

Figure 5A:
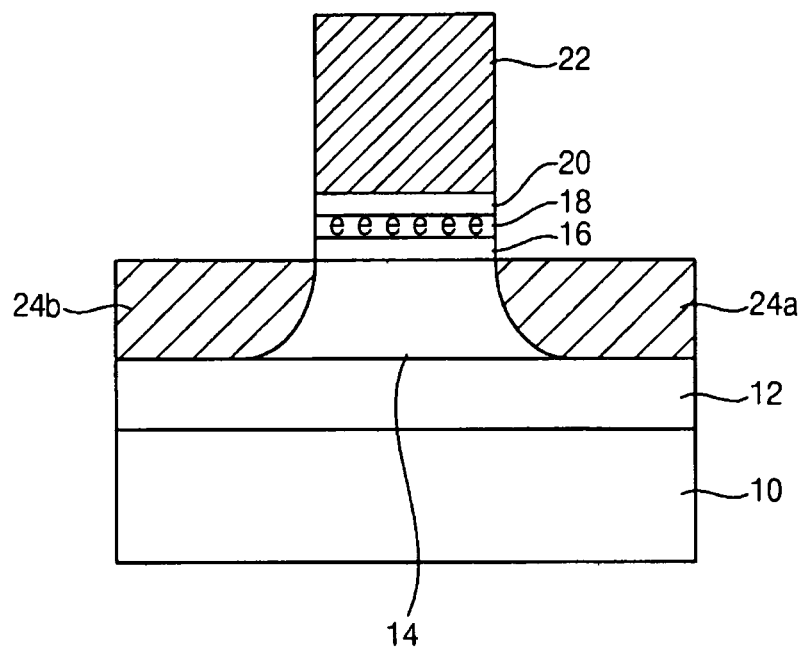
FIGS. 5A-5D are cross-sectional diagrams illustrating charge distribution in a memory cell for different multi-bit data states.
Figure 5B:
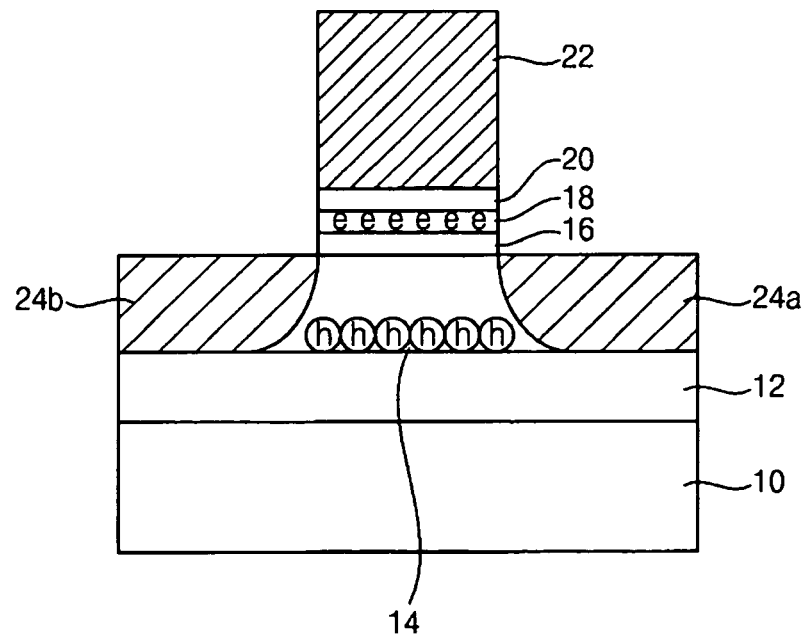
Figure 5C:
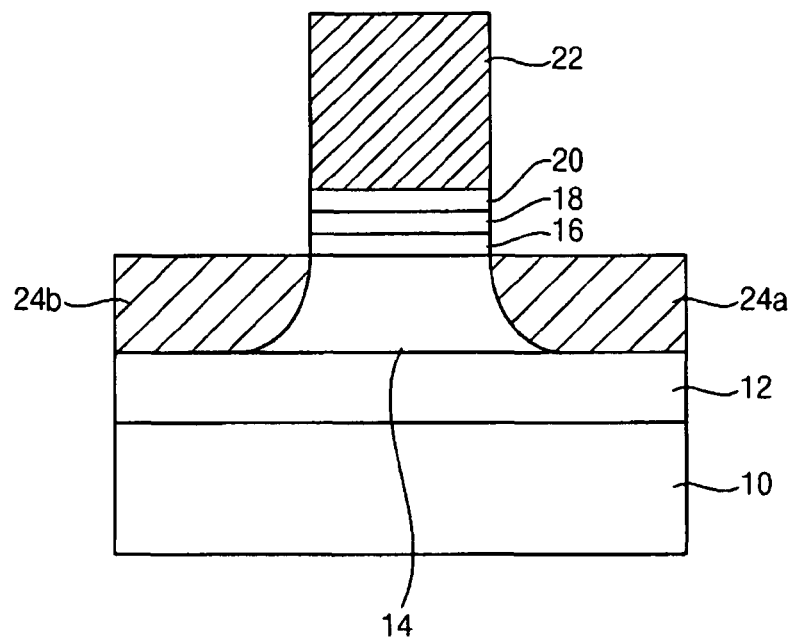
Figure 5D:
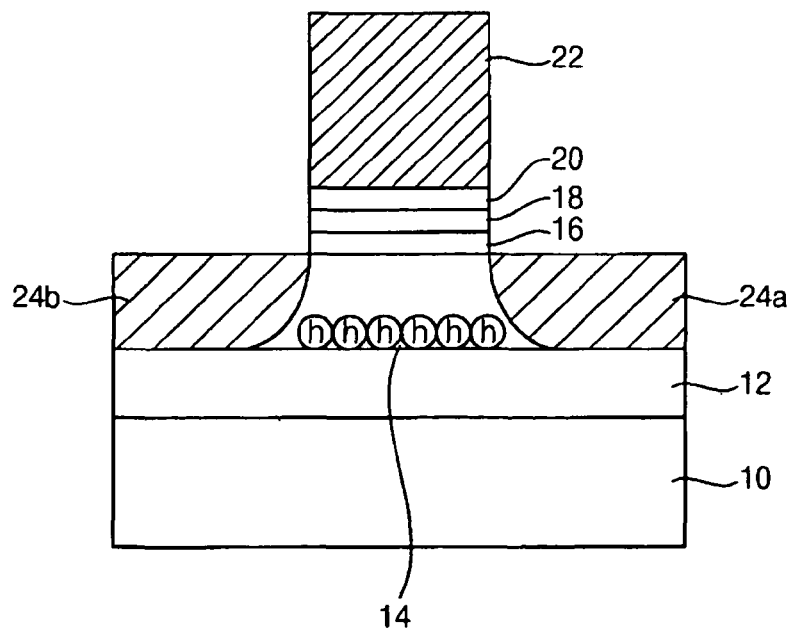

FIGS. 5A-5D are cross-sectional diagrams illustrating charge distribution in a memory cell for different multi-bit data states. FIG. 5A may show carrier charge distribution of a data state (0,0). FIG. 5B may show carrier charge distribution of a data state (1,0). FIG. 5C may show carrier charge distribution of a data state (0,1). FIG. 5D may show carrier charge distribution of a data state (1,1). FIGS. 5A-5D may show a state where the MSB is programmed or erased using impact ionization and GIDL.

Figure 6:
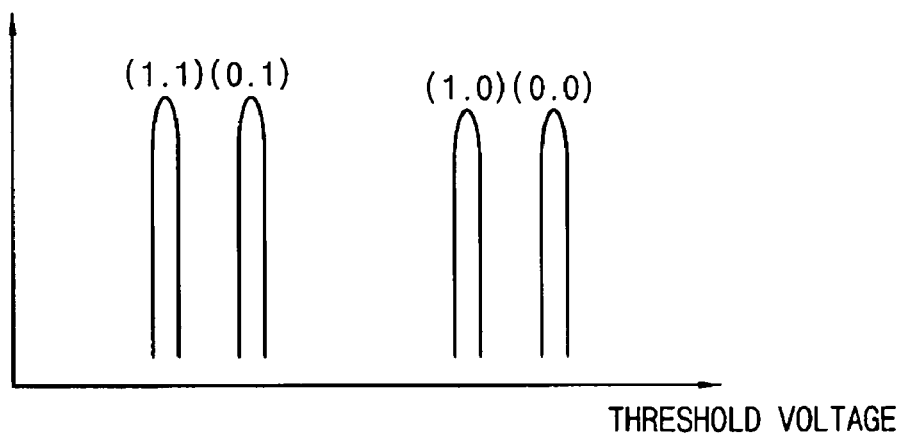

FIG. 6 is a graph illustrating a distribution of threshold voltages, the threshold voltages corresponding to different multi-bit data states of a memory cell. Referring to FIG. 6, the threshold voltage of each data state is enumerated in order from high to low voltage and described as follows: the data state (0,0) in which electrons may be trapped in the charge trap layer, the data state (1,0) in which electrons may be trapped in the charge trap layer and holes may be stored in the floating body, the data state (0,1) in which nothing may be stored in the charge trap layer and the floating body and the data state (1,1) in which holes may be stored in the floating body. The data state (0,0) may have a threshold voltage larger than that of the data state (1,0). The data state (1,0) may have a threshold voltage larger than that of the data state (0,1). The data state (0,1) may have a threshold voltage larger than that of the data state (1,1). FIG. 6 may represent data written in a memory cell according to FIG. 2. Read current versus gate voltage according to the data may be simulated.

Figure 7:
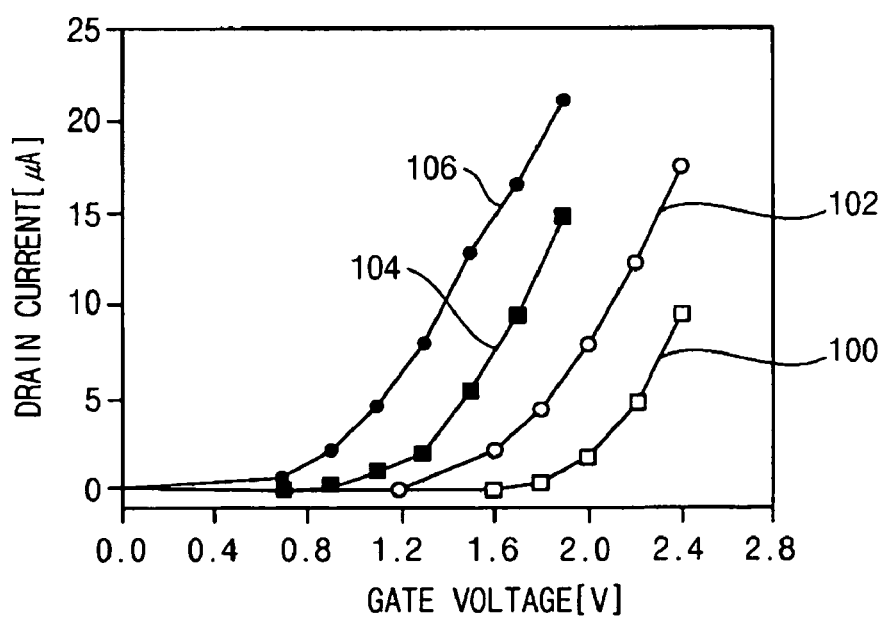

FIG. 7 is a graph of drain current as a function of gate voltage illustrating memory cell read currents corresponding to different multi-bit data states of a memory cell. A memory cell used in a simulation producing the graph of FIG. 7 may have a gate with a length of 3 μm and a width of 4 μm. About 0.5V may be applied to the drain region and about −40V may be applied as a back gate voltage. Referring to FIG. 7, reference numeral 100 may represent read current as a function of gate voltage for a (0,0) data state in which charge is programmed in the charge trap layer. Reference numeral 102 may represents read current as a function of gate voltage for a (1,0) data state in which charge is programmed in the charge trap layer and holes are trapped in the floating body. Reference numeral 104 may represent read current as a function of gate voltage for a (0,1) data state in which nothing is stored in the charge trap layer and the floating body. Reference numeral 106 may represent read current as a function of gate voltage for a (1,1) data state in which holes are trapped in the floating body.

As illustrated in FIG. 7, the read current as a function of gate voltage is different according to the data state of a memory cell and the threshold voltage is different according to the data state of a memory cell.

Operation of Reading Data

Multi-bit data may be written in a memory cell by, for example, the methods described above. Methods of reading data written in the memory cell will now be described.

Method of Reading Data Using Current Sensing

Figure 8:
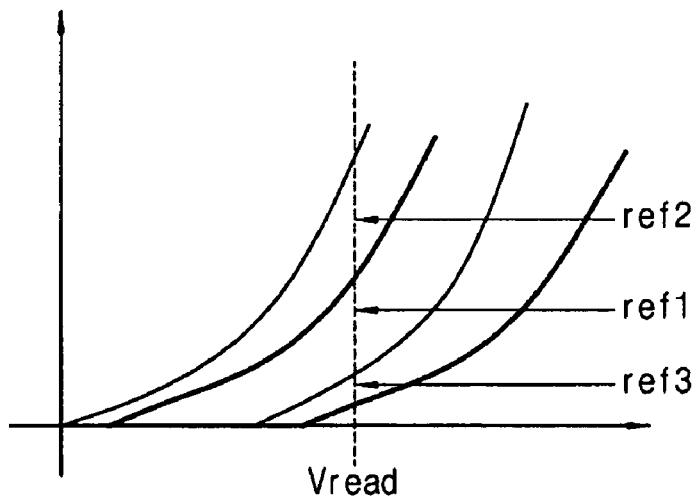

FIG. 8 is a graph of drain current as a function of gate voltage illustrating a method of reading multi-bit data using reference drain currents. Referring to FIGS. 2 and 8, a cell on which a reading operation will be performed may be selected. A read voltage Vread may applied to a gate electrode 22 of the selected cell, a read drain voltage may be applied to a drain region 24*b* of the cell and a voltage lower than the read drain voltage may be applied to a source region 24*a* of the selected cell. Alternatively, the source region 24*a* may be, for example, connected to ground. When a read voltage Vread is applied to a gate electrode 22, current in the memory cell may be different according to the data state of the selected cell. Multi-bit data may be read by comparing drain current output from the selected cell with reference drain currents. A data state is determined by sensing the level of drain current in relation to reference currents.

The reference currents may include a first reference current ref1 for identifying LSB data, a second reference current ref2 and a third reference current ref3 for identifying MSB data. For example, when a reading voltage Vread is applied to a gate electrode 22, the first reference current ref1 may be determined to have a value between a first drain current and a second drain current. The first drain current may be a drain current when the LSB is a "0" and the MSB is a "1", and the second drain current may be a drain current when the LSB is a "1" and MSB is a "0". When the LSB is determined to be a "1", the second reference current ref2 may be determined to have a value between the second drain current and a third drain current. The third drain current may be a drain current when the MSB is a "1" in a condition that the reading voltage Vread is applied to a gate electrode 22. When the LSB is determined to be a "0", the third reference current ref3 may be determined to have a value between the first drain current and a fourth drain current. The fourth drain current may be a drain current when the MSB is a "0" in a condition that the read voltage Vread is applied to a gate electrode 22.

When data is read in a memory cell, a drain current of the cell may be compared with the first reference current ref1. When the drain current has a current substantially higher than the first reference current ref1, the LSB may be sensed as a "1". When the drain current has a current substantially lower than the first reference current ref1, the LSB may be sensed as a "0".

When the LSB is sensed as a "1", the drain current may be compared to the second reference current ref2. When the drain current has a current substantially higher than the second reference current ref2, the MSB may be sensed as a "1". Accordingly, the read data may be a data state (1,1). When the drain current has a current substantially lower than the second reference current ref2, the MSB may be sensed as a "0". Accordingly, the read data may be a data state (0,1).

When the LSB is sensed as a "0", the drain current may be compared to the third reference current ref3. When the drain current has a current substantially higher than the third reference current ref3, the MSB may be sensed as a "1". Accordingly, the read data may be a data state (1,0). When the drain current has a current substantially lower than the third reference current ref3, the MSB may be sensed as a "0". Accordingly, the read data may be a data state (0,0).

As described above, two steps of comparing drain current at a read gate voltage to reference currents may be performed in order to read multi-bit data from a selected cell.

Method of Reading Data Using Threshold Voltage Sensing

Figure 9:
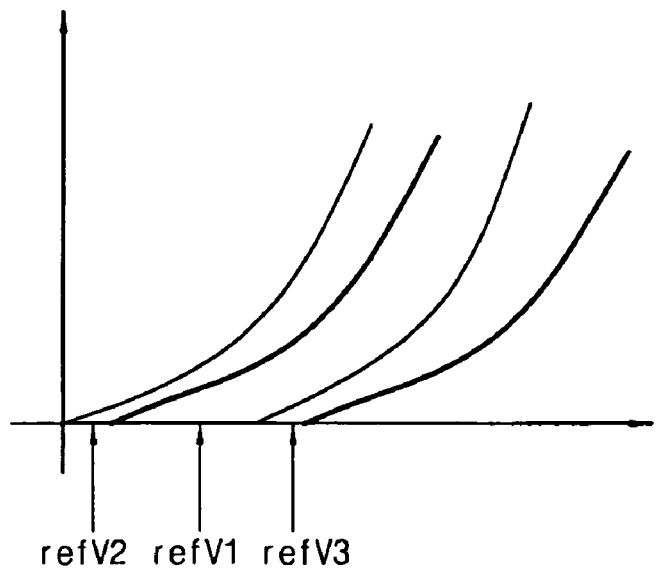

FIG. 9 is a graph of drain current as a function of gate voltage illustrating a method of reading multi-bit data using reference gate voltages. Referring to FIG. 9, a cell on which a reading operation will be performed may be selected. A read drain voltage may be applied to the drain region 24*b* of the selected cell and a voltage lower than the read drain voltage may be applied to the source region 24*a* of the selected cell. Alternatively, the source region 24*a* may be, for example, connected to ground. Multi-bit data of the memory cell may be read by applying reference voltages refV1, refV2, and refV3 to the gate electrode 22 and determining whether or not a current flows at each of the applied reference voltages. If current flows at a reference voltage, the threshold voltage has been "sensed". A current "flows" if it substantially exceeds a reference current. According to example embodiments with respect to FIG. 9, a reference current may be, for example, a sub-threshold current.

The reference voltages may include a first reference voltage refV1 for identifying a LSB, and second and third reference voltages refV2 and refV3 for identifying a MSB. For example, the first reference voltage refV1 may be determined to have a value between a first threshold voltage and a second threshold voltage. The first threshold voltage may be a voltage when the LSB is a "0" and the MSB is a "1", and the second threshold voltage may be a voltage when the LSB is a "1" and the MSB is a "0". When LSB data is determined to be a "1", the second reference voltage refV2 may be determined to have a value between the second threshold voltage and a third threshold voltage. The third threshold voltage may be a voltage when the MSB is a "1". When the LSB is determined to be a "0", the third reference voltage refV3 may be determined to have a value between the first threshold voltage and a fourth threshold voltage. The fourth threshold voltage may be a voltage when the MSB is a "0".

When the first reference voltage refV1 is applied to the gate, whether or not drain current flows due to the turning on of the memory cell may be sensed. When the drain current has a current substantially higher than a reference current, the LSB may be sensed as a "1", and when the drain current has a current substantially lower than a reference current, the LSB may be sensed as a "0". When the LSB is sensed as a "1", the second reference voltage refV2 may be applied to the gate to determine whether or not a drain current flows due to the turning on of the memory cell. When the drain current has a current substantially higher than a reference current, the MSB may be sensed as a "1", so that the multi-level data may be read as (1,1). When the drain current has a current substantially lower than a reference current, the MSB may be sensed as a "0", so that the multi-level data may be read as (0,1).

Alternatively, when the LSB is sensed as a "0", the third reference voltage refV3 may be applied to the gate, and then it may be sensed whether or not a drain current flows due to the turning on of the memory cell. When the drain current has a current substantially higher than a reference current, the MSB may be sensed as a "1", so that the multi-bit data may be read as (1,0). When the drain current has a current substantially lower than a reference current, the MSB may be sensed as a "0", so that the multi-bit data is read as (0,0).

Method of Reading Data Using Threshold Voltage Sensing and Current Sensing

According to example embodiments, multi-bit data may be read using both threshold voltage sensing and current sensing methods. A LSB may be read using threshold voltage sensing and a MSB may be read by current sensing. A memory cell on which the reading operation will be performed may be selected. A read drain voltage may be applied to the drain region 24b of the selected cell and a voltage lower than the read drain voltage may be applied to the source region 24a of the selected cell. Alternatively, the source region 24a may be, for example, connected to ground.

Figure 10:
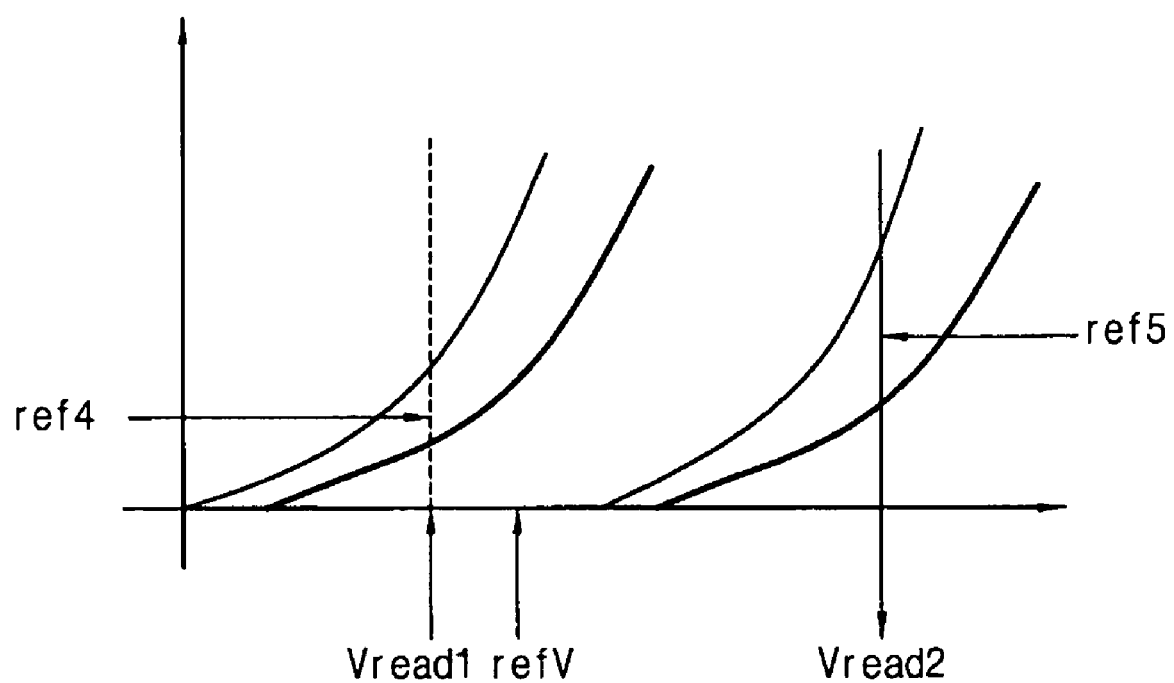

FIG. 10 is a graph of drain current as a function of gate voltage illustrating a method of reading multi-bit data using a reference gate voltage and reference drain currents. A reference read voltage refV may be applied to the gate electrode 22. While the reference read voltage refV is applied to the gate electrode 22, the LSB of the cell may be read by determining whether or not a current flows. The reference read voltage refV may be determined to have a value between a threshold voltage when the LSB is a "0" and a threshold voltage when the LSB is a "1". When the reference voltage for reading refV is applied to the gate electrode 22, whether or not a drain current flows due to the turning on of the memory cell is sensed in order to read LSB data from the cell. When the drain current has a current substantially higher than a reference current (e.g., a reference current according to threshold voltage sensing), the LSB may be sensed as a "1", and when the drain current has a current substantially lower than the reference current, the LSB may be sensed as a "0". After sensing the LSB data, a first reading voltage (Vread1) or a second reading voltage (Vread2) may be applied to the gate electrode according to the sensed LSB data to sense MSB data using a drain current according to a current sensing method.

With regards to the LSB, a difference between a threshold voltage of the data state "0" and a threshold voltage of the data state "1" may be large. Accordingly, sensing using the voltage difference may be reliable, easy, and/or improved. As described above, the MSB may be sensed using a drain current. In sensing the MSB, because a difference between a threshold voltage of data "1" of the MSB and a threshold voltage of data "0" of the MSB may not be sufficiently large and/or increased, sensing the MSB using threshold voltage may not be easy. Accordingly, sensing the MSB using a reference drain current may be preferable.

When the LSB is a "1", Vread1 may be applied to the gate electrode 22. A fourth reference current ref4 may have a magnitude between that of a drain current when the MSB is a "0" and a drain current when the MSB is a "1" under conditions in which the Vread1 is applied to the gate electrode 22. When the LSB is a "1", the Vread1 may be applied to the gate electrode 22 and a measured drain current may be compared with the fourth reference current ref4. If the measured drain current has a current substantially higher than the fourth reference current ref4, the MSB may be sensed as a "1", so that the multi-bit data may be read as (1,1). If the measured drain current has a current substantially lower than the fourth reference current ref4, the MSB may be sensed as a "0", so that the multi-bit data may be read as (0,1).

When the LSB is a "0", the Vread2 may be applied to the gate electrode 22. A fifth reference current ref5 may have a value between a drain current when the MSB is a "0" and a drain current when the MSB is a "1" under conditions in which the Vread2 is applied to the gate electrode 22. When the LSB is a "0", the Vread2 may be applied to the gate electrode 22, and a measured drain current may be compared with the fifth reference current ref5. If the measured drain current has a current substantially higher than the fifth reference current ref5, the MSB may be sensed as a "1", so that the multi-bit data may be read as (1,0). If the measured drain current has a current substantially lower than the fifth reference current ref5, the MSB may be sensed as a "0", so that the multi-bit data may be read as (0,0).

Reading using a BJT method is described together with a writing method using the BJT method (above).

According to example embodiments, 2-bit data may be stored in one cell. Each bit of the 2-bit data may be stored in different storing positions within a single memory cell. Example embodiments may be used to operate a cell of a memory device requiring high capacity. While example embodiments have been particularly shown and described, it will be understood by one of ordinary skill in the art that variations in form and detail may be made therein without departing from the spirit and scope of the claims.

What is claimed is:

1. A method of writing data to a semiconductor memory device, the semiconductor memory device including a floating body on a substrate, a gate electrode on the floating body and electrically insulated from the floating body, source and drain regions on the substrate adjacent to the gate electrode, and a charge trap layer between the floating body and the gate electrode, the method comprising:
- writing a first bit to the charge trap layer; and
- writing a second bit to the floating body.

2. The method of claim 1, wherein the writing a first bit includes at least one of trapping a charge in the charge trap layer and erasing a charge from the charge trap layer.

3. The method of claim 2, wherein
- the writing a first bit includes the trapping a charge in the charge trap layer, and
- the trapping a charge in the charge trap layer includes applying a gate programming voltage to the gate electrode, applying a drain programming voltage to the drain region, and applying a lower voltage than the drain programming voltage to the source region.

4. The method of claim 2, wherein
- the writing a first bit includes the trapping a charge in the charge trap layer, and
- the trapping a charge in the charge trap layer includes applying a gate programming voltage to the gate electrode, and grounding the drain and source regions.

5. The method of claim 1, wherein the writing a second bit includes at least one of storing holes in the floating body and erasing holes from the floating body.

6. The method of claim 5, wherein
- the writing a second bit includes the storing holes in the floating body, and
- the storing holes in the floating body includes applying a gate programming voltage to the gate electrode, applying a drain programming voltage to the drain region, and applying a lower voltage than the drain programming voltage to the source region.

7. The method of claim 5, wherein
- the writing a second bit includes the erasing holes from the floating body, and
- the erasing holes from the floating body includes applying a positive gate voltage to the gate electrode, a negative erasing voltage to the drain region, and grounding the source region.

8. The method of claim 5, wherein
- the writing a second bit includes the storing holes in the floating body, and
- the storing holes in the floating body includes applying voltages to the source region, the floating body and the drain region so that the source region is forward biased with respect to the floating body and the drain region is reverse biased with respect to the floating body, so that holes accumulate in a channel region, and applying a negative voltage to the gate electrode and grounding the source and drain regions, so that accumulated holes are maintained in the channel region.

9. The method of claim 8, wherein
- the writing a second bit includes the erasing holes from the floating body, and
- the erasing holes from the floating body includes applying voltages to the source region, the floating body and the drain region to lower a voltage barrier of the source region and the floating body, so that holes are removed from the channel region, and applying a negative voltage to the gate electrode and grounding the source and drain region.

10. A method of reading multi-bit data in a multi-bit semiconductor memory device, the multi-bit semiconductor device including a floating body on a substrate, a gate electrode on the floating body and electrically insulated from the floating body, source and drain regions on the substrate adjacent to the gate electrode, and a charge trap layer between the floating body and the gate electrode, the method comprising:
- applying a read gate voltage to the gate electrode;
- applying a read drain voltage to the drain region;
- applying a read source voltage that is lower than the read drain voltage to the source region; and
- outputting multi-bit data by comparing a drain current with reference currents,
- wherein the reference currents include a first reference current for determining a least significant bit (LSB) data state of the memory,
- a second reference current, and
- a third reference current, one or more of the second and third reference currents for determining a most significant bit (MSB) data state of the memory.

11. The method of claim 10, wherein
- the first reference current has a value between a first read drain current corresponding to a LSB data of "0" and a second read drain current corresponding to a LSB of "1",
- the second reference current has a value between the second read drain current and a third read drain current, the third read drain current corresponding to a MSB of "1" and a LSB of "1",
- the third reference current has a value between the first read drain current and a fourth read drain current, the fourth read drain current corresponding to a MSB of "0" and a LSB of "0", and
- the first through fourth read drain currents are drain currents when a reading voltage is applied to the gate electrode.

12. The method of claim 11, wherein
- the outputting multi-bit data includes determining the LSB by comparing the drain current with the first reference current, and
- determining the MSB by one of comparing the drain current with the second reference current when the LSB is a "1" and comparing the drain current with the third reference current when the LSB is a "0".

13. A method of reading data in a semiconductor memory device, the semiconductor memory device including a floating body on a substrate, a gate electrode on the floating body and electrically insulated from the floating body, source and drain regions on the substrate adjacent to the gate electrode, and a charge trap layer between the floating body and the gate electrode, the method comprising:
- applying a read drain voltage to the drain region;
- applying a read source voltage lower than the read drain voltage to the source region;
- sequentially applying reference voltages to the gate electrode; and
- outputting multi-bit data of the memory by determining whether or not a drain current flows at one or more of the reference voltages.

14. The method of claim 13, wherein
- the reference voltages include a first reference voltage for determining a least significant bit (LSB) data state of the memory,
- a second reference voltage, and
- and a third reference voltage, one or more of the second and third reference voltages for determining a most significant bit (MSB) data state of the memory.

15. The method of claim 14, wherein
- the first reference voltage has a value between a first threshold voltage corresponding to a LSB of "0" and a MSB of "1" and a second threshold voltage corresponding to a LSB of "1" and MSB of "0", the second reference voltage has a value between the second threshold voltage and a third threshold voltage corresponding to a MSB of "1 " and a LSB of "1", and the third reference voltage has a value between the first threshold voltage and a fourth threshold voltage, the fourth threshold voltage corresponding to a MSB of "0" and a LSB of "0".

16. The method of claim 15, wherein the outputting multi-bit data of the memory includes determining the LSB according to whether or not a drain current flows when the first reference voltage is applied to the gate electrode, and determining the MSB according to one of whether or not a drain current flows when the second reference voltage is applied to the gate electrode if the LSB is a "1" and whether or not a drain current flows when the third reference voltage is applied to the gate electrode if the LSB is a "0".

17. A method of reading data in a semiconductor memory device, the semiconductor memory device including a floating body on a substrate, a gate electrode on the floating body and electrically insulated from the floating body, source and drain regions on the substrate adjacent to the gate electrode, and a charge trap layer between the floating body and the gate electrode, the method comprising:

applying a read drain voltage to the drain region;

applying a read source voltage lower than the read drain voltage to the source region;

applying a reference voltage to the gate electrode and determining a least significant bit (LSB) data state of the memory based on whether or not a first drain current flows; and applying one of a first read gate voltage to the gate electrode if the LSB is a "1" and determining a most significant bit (MSB) data state of the memory by comparing a second drain current that is output when applying the first read gate voltage with a first reference current and a second read gate voltage to the gate electrode if the LSB is a "0" and determining the MSB data state of the memory by comparing a third drain current that is output when applying the second read gate voltage with a second reference current.

18. The method of claim 17, wherein the first reference current has a value between that of a drain current corresponding to a MSB of "0" and a LSB of "1" when the first read gate voltage is applied to the gate electrode and a drain current corresponding to a MSB of "1 " and a LSB of "1 " when the first read gate voltage is applied to the gate electrode.

19. The method of claim 18, wherein the second reference current has a value between that of a drain current corresponding to a MSB of "0" and a LSB of "0" when the second read gate voltage is applied to the gate electrode and a drain current corresponding to a MSB of "1" and a LSB of "0" when the second read gate voltage is applied to the gate electrode.

* * * * *